(12) United States Patent
Baik et al.

(10) Patent No.: US 9,733,296 B2
(45) Date of Patent: Aug. 15, 2017

(54) MULTI-PHASE TURN-ON BLANKING TIME WITH VBATT-BASED FAULT THRESHOLD VOLTAGE

(71) Applicant: CONTINENTAL AUTOMOTIVE SYSTEMS, INC., Auburn Hills, MI (US)

(72) Inventors: Chung Heum Baik, Rochester Hills, MI (US); Jorge Gonzalez-Amaya, Lake Orion, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 14/946,405

(22) Filed: Nov. 19, 2015

(65) Prior Publication Data

US 2017/0146583 A1    May 25, 2017

(51) Int. Cl.
*G01R 31/02* (2006.01)
*G01R 31/08* (2006.01)
(Continued)

(52) U.S. Cl.
CPC .......... *G01R 31/025* (2013.01); *G01R 31/024* (2013.01); *G01R 31/3644* (2013.01); *H02H 7/18* (2013.01); *G01R 31/021* (2013.01)

(58) Field of Classification Search
CPC .... G01R 31/00; G01R 31/005; G01R 31/006; G01R 31/02; G01R 31/021; G01R 31/022; G01R 31/024; G01R 31/025; G01R 31/026; G01R 31/083; G01R 31/12; G01R 31/1218; G01R 31/1272; G01R 31/14; G01R 31/2805; G01R 31/2812; G01R 31/3644; G01R 27/02; G01R 27/26; G01R 27/2605; G01R 27/2617; G01R 1/07328; G01N 27/82; G01N 27/90; G01N 27/9046;
(Continued)

(56) References Cited

U.S. PATENT DOCUMENTS 4,322,641 A * 3/1982 Packard ............. H03H 11/1291
                                                         327/311
5,063,931 A * 11/1991 Leavitt ..................... A61B 8/06
                                                          600/453
(Continued)

OTHER PUBLICATIONS

International Search Report and Written Opinion dated Dec. 7, 2016 from corresponding International Patent Application No. PCT/US2016/050176.
(Continued)

*Primary Examiner* — Hoai-An D Nguyen

(57) ABSTRACT

A low-side (LS) output pre-driver has a short-circuit-to-battery fault detection scheme for a MOSFET switch having a drain connection to a load connected to a battery voltage and a source connection tied to ground. The LS output pre-driver includes a comparator, a reference voltage selector, a multi-phase blank/filter, a multi-phase control timer. The first signal of the multi-phase control timer instructs the reference voltage selector to select which of the plurality of reference voltage signals is provided to the second input of the comparator. The second signal of the multi-phase control timer instructs the multi-phase blank/filter to change from one of the plurality of time intervals to another of the plurality of time intervals.

20 Claims, 2 Drawing Sheets

(51) Int. Cl.
*G01R 31/36* (2006.01)
*H02H 7/18* (2006.01)

(58) Field of Classification Search
CPC .... B60L 3/0069; B60L 3/04; B60L 2240/547; B60L 2270/147; H01B 7/328; H04B 3/46; H02H 7/18
USPC ....... 324/500, 509, 512, 522, 523, 527, 528, 324/531, 537, 538, 539, 541, 544, 551, 324/555, 557; 702/1, 57, 58, 59
See application file for complete search history.

(56) References Cited

U.S. PATENT DOCUMENTS

| | | | | |
|---|---|---|---|---|
| 5,933,012 A | * | 8/1999 | Bengtsson | G01R 15/181 324/524 |
| 6,038,516 A | * | 3/2000 | Alexander | H02H 3/04 702/67 |
| 6,172,862 B1 | * | 1/2001 | Jonnatti | H02H 1/0015 340/647 |
| 6,456,511 B1 | * | 9/2002 | Wong | H02M 1/36 363/21.13 |
| 6,774,639 B1 | * | 8/2004 | Unsworth | H01H 33/26 324/535 |
| 8,067,988 B2 | * | 11/2011 | Chen | H03L 7/0995 331/16 |
| 2010/0134939 A1 | | 6/2010 | Takahashi et al. | |
| 2010/0328831 A1 | | 12/2010 | Zhang et al. | |
| 2011/0169423 A1 | * | 7/2011 | Huang | H05B 33/0815 315/297 |
| 2012/0062148 A1 | * | 3/2012 | Kim | H05B 33/0815 315/297 |
| 2012/0119799 A1 | * | 5/2012 | Liu | G01R 23/15 327/142 |
| 2012/0223722 A1 | * | 9/2012 | Ueda | G01R 31/362 324/537 |
| 2013/0314836 A1 | | 11/2013 | Christie | |
| 2015/0330650 A1 | * | 11/2015 | Abiprojo | F24F 11/006 700/276 |

OTHER PUBLICATIONS

Advance Information—Analog Integrated Circuit Device Data Sheet for MC35XS3400, NXP/Freescale Semiconductor, Inc., Rev. 10.0, Aug. 2013.

\* cited by examiner

MULTI-PHASE TURN-ON BLANKING TIME WITH VBATT-BASED FAULT THRESHOLD VOLTAGE

FIELD

The present disclosure relates to electronic power systems, and more particularly to electronic controller fault detection.

BACKGROUND

The statements in this section merely provide background information related to the present disclosure and may or may not constitute prior art.

A low-side (LS) pre-driver for short-circuit-to-battery (SCB)/overcurrent fault detection scheme includes a single-phase turn-on blanking time and a fault threshold voltage or a reference voltage based on either 5V or 3.3V. The resultant blank time at the threshold voltage extends for a long period, approximately 25 μsec for avoiding false SCB default detection, such that the potential peak power at the MOSFET is upwards to 825 W. Therefore, the MOSFET is sized to handle the SCB default detection power instead of being sized to handle the non-default operation of the LS pre-driver.

While current SCB fault detection schemes perform as designed, there is room in the art for improved SCB fault detection schemes that exhibit improved performance and enable further design possibilities to improve cost, reliability, and performance.

SUMMARY

A low-side (LS) output pre-driver having a short-circuit-to-battery fault detection scheme for a MOSFET switch having a drain connection to a load connected to a battery voltage and a source connection tied to ground is provided. The LS output pre-driver includes a comparator, a reference voltage selector, a multi-phase blank/filter, and a multi-phase control timer. The comparator has a first input, a second input, and an output. The first input of the comparator is configured to receive a voltage indicative of the voltage at the drain connection. The reference voltage selector configured to output one of a plurality of reference voltage signals to the second input of the comparator. The multi-phase blank/filter having an input connection and an output connection. The multi-phase blank/filter is configured to blank an incoming signal received from the comparator output during a plurality of time intervals. The multi-phase control timer having a first timer output connection and a second timer output connection. The first timer output connection is configured to send a first signal to the reference voltage selector and the second timer output connection is configured to send a second signal to the multi-phase blank/filter. The first signal of the multi-phase control timer instructs the reference voltage selector to select which of the plurality of reference voltage signals is provided to the second input of the comparator. The second signal of the multi-phase control timer instructs the multi-phase blank/filter to change from one of the plurality of time intervals to another of the plurality of time intervals.

In another example of the present invention, each of the plurality of reference voltage signals is a percentage of the maximum of the battery voltage and a predetermined limit voltage.

In yet another example of the present invention, the predetermined limit voltage is 12 volts.

In yet another example of the present invention, the plurality of reference voltage signals includes a first, a second, and a third reference voltage signal.

In yet another example of the present invention, the plurality of reference voltage signals are obtained by a plurality of voltage divider circuits fed from a common voltage source.

In yet another example of the present invention, the plurality of time intervals includes a first time interval, a second time interval, and a third time interval.

In yet another example of the present invention, the first time interval is about 12 μsec, the second time interval is about 12 μsec, and the third time interval is about 10 μsec.

In yet another example of the present invention, the reference voltage selector further includes seven resistors, a Zener diode, and a selector, and wherein the first reference voltage signal is approximately 7% of battery voltage, the second voltage signal is approximately 50% of battery voltage, and the third reference voltage is approximately 92% of battery voltage.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
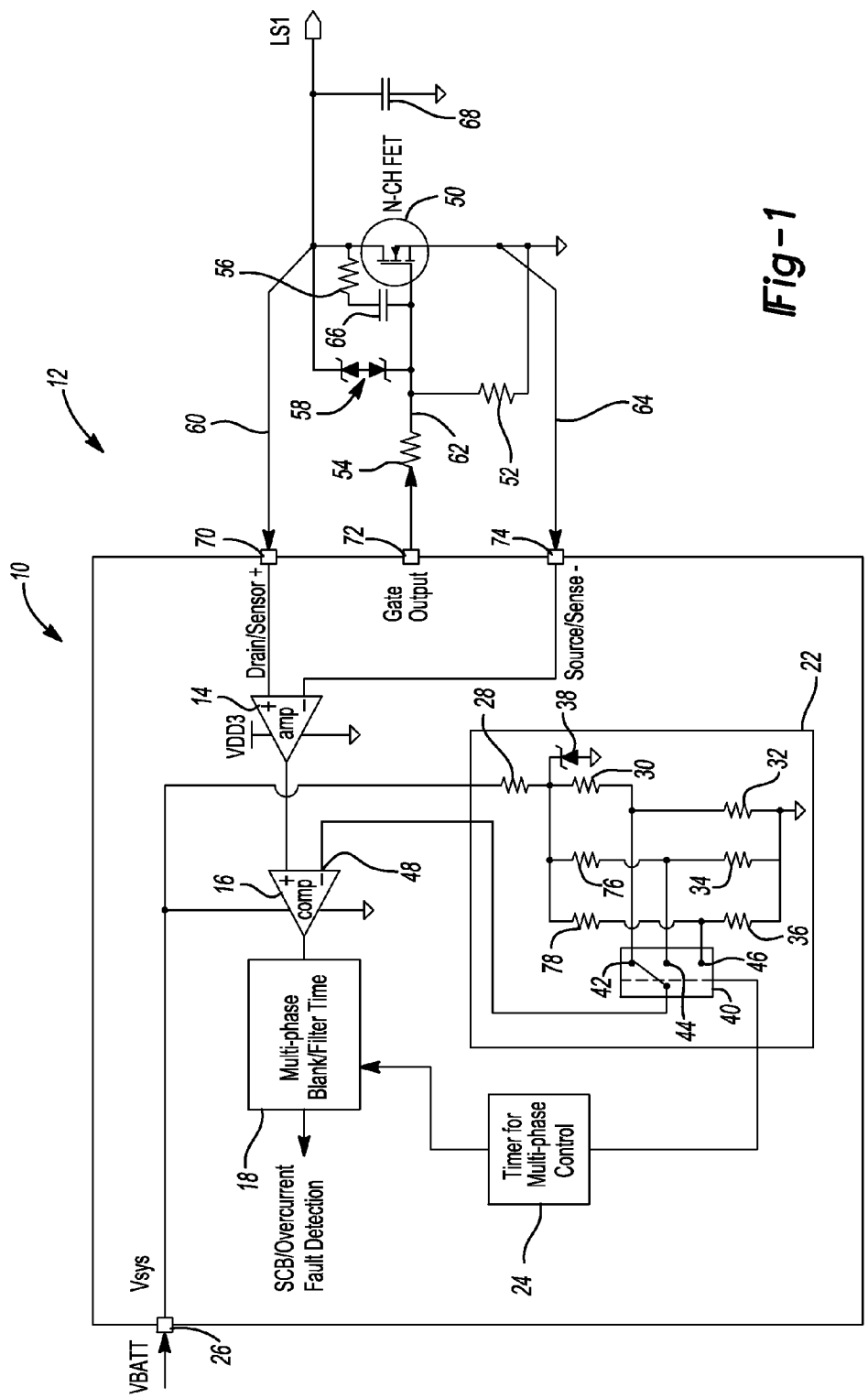
FIG. 1 is a schematic diagram of a low-side output pre-driver having short-circuit-to-battery fault detection, in accordance with an embodiment of the present invention.

Referring to the drawings, wherein like reference numbers refer to like components, in FIG. 1 an electronic schematic for a low-side (LS) output pre-driver 10 for a switch 12 is illustrated and will now be described. The LS pre-driver 10 includes an amplifier 14, a comparator 16, a multi-phase blank/filter 18, a reference voltage selector 22, and a multi-phase control timer 24. More specifically, a battery voltage (VBATT) 26 is coupled to the reference voltage selector 22 and powers the comparator 16. The LS output pre-driver 10 is coupled to the switch 12 via a first or drain connection 70, a second or gate connection 72, and a third or source connection 74.

The amplifier 14 of the LS output pre-driver 10 buffers and/or amplifies the voltage difference between the drain connection 70 and the source connection 74. The voltage from the amplifier 14 is compared to the reference voltage of the reference voltage selector 22. The output of the comparator 16 is coupled to the multi-phase blank/filter 18.

The reference voltage selector 22 is capable of providing at least three different reference voltages to the comparator 16. The reference voltage selector 22 includes a first through seventh resistors 28, 30, 32, 34, 36, 76, 78, a first Zener diode 38, and a selector 40. In the example shown in FIG. 1, the first resistor 28 is a 2KΩ resistor configured to provide bias current to the Zener diode 38. The voltage selector circuit 22 is configured to provide a reference voltage VREF to a plurality of voltage dividers. The reference voltage VREF is limited to the Zener voltage (12 volts in the embodiment shown) for battery voltage VBATT in excess of the Zener voltage. For a battery voltage value VBATT less than the Zener voltage, the reference voltage VREF is essentially equal to the battery voltage VBATT. A first voltage divider circuit comprises resistor 30 (40KΩ in the embodiment shown) in series with the resistor 32 (3KΩ in the embodiment shown), to produce a voltage at node 42 equal to VREF*3/43, or approximately 7% of VREF with the resistor values shown. A second voltage divider circuit comprises resistor 76 (40KΩ in the embodiment shown) in series with resistor 34 (40KΩ in the embodiment shown), to produce a voltage at node 44 equal to VREF*40/80, or 50% of VREF with the resistor values shown. A third voltage divider circuit comprises resistor 78 (40KΩ in the embodiment shown) in series with resistor 36 (440KΩ in the embodiment shown), to produce a voltage at node 46 equal to VREF*440/480, or approximately 92% of VREF.

The selector 40 is depicted as a switch whose common connection, i.e. the node connected input 48 of comparator 16, can be selectively connected to one of the three voltage divider output voltages 42, 44, 46. Each of the first, second, and third voltage divider nodes 42, 44, 44 is selectively coupled with a reference voltage input 48 of the comparator 16. When the reference voltage input 48 of the comparator 16 is coupled with the first node 42, a first reference voltage ($1^{st}$ Vth_fault) is selected. When the reference voltage input 48 of the comparator 16 is coupled with the second node 44, a second reference voltage ($2^{nd}$ Vth_fault) is selected. When the reference voltage input 48 of the comparator 16 is coupled with the third node 46, a third reference voltage ($3^{rd}$ Vth fault) is selected.

The multi-phase control timer 24 provides a signal to the selector 40 for selecting, for example, the first node 42 or first reference voltage ($1^{st}$ Vth_fault) the second node 44 or second reference voltage ($2^{nd}$ Vth_fault) or the third node 46 or third reference voltage ($3^{rd}$ Vth_fault).

The multi-phase control timer 24 also provides a signal to the multi-phase blank/filter 18. The signal from the multi-phase control timer 24 provides a blanking interval during which the multi-phase blank/filter 18 inhibits the fault detection signal from the comparator 16. For example, the multi-phase blank/filter 18 may inhibit the comparator 16 fault signal at multiple instances for a specific duration of each instance. In the present embodiment, a first blank time is 12 μsec, a second blank time is 12 μsec, and a third blank time is 10 μsec. During each of the blank times, the comparator 16 fault signal is blocked from reaching a receiver of the SCB/Overcurrent fault detection signal. Furthermore, when combined with the reference voltage selector 22 the first blank time is coupled with the first reference voltage ($1^{st}$ Vth_fault) such that if the actual LS output drain voltage is larger than the first reference voltage ($1^{st}$ Vth_fault) as the first blank time expires, the SCB/Overcurrent fault is detected.

The switch 12 includes an N-channel MOSFET 50, a first, second, and third resistors 52, 54, 56, a waveform clipper 58, and a first and second capacitor 66, 68. More specifically, the MOSFET 50 includes a drain 60, a gate 62, and a source 64. The drain 60 and source 64 are coupled as inputs to the amplifier 14 of the LS output pre-driver 10. The waveform clipper 58 is coupled in parallel with the MOSFET 50 between the gate 62 and the drain 60. The first resistor 52 is coupled in parallel with the MOSFET 50 between the source 64 and the gate 62 and is a 47K resistor. The second resistor 54 is coupled in series with the gate 62 and is a 1K resistor. The third resistor 56 and the first capacitor 66 are coupled together in series and are further coupled in parallel with the MOSFET 50 between the gate 62 and the drain 60. The third resistor 56 is a 47K resistor while the first capacitor 66 is a 470 pF capacitor. The second capacitor 68 is a 10 nF capacitor and grounds the drain 60.

Figure 2:
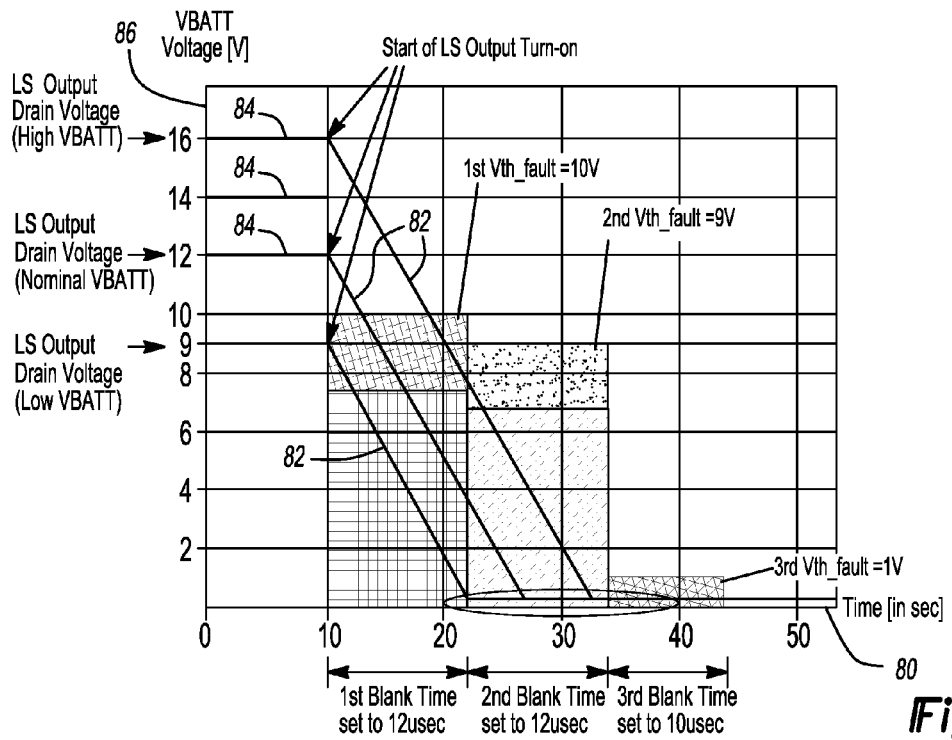
FIG. 2 is plot showing LS output drain voltage as a function of time, in accordance with an embodiment of the present invention.
Figure 3:
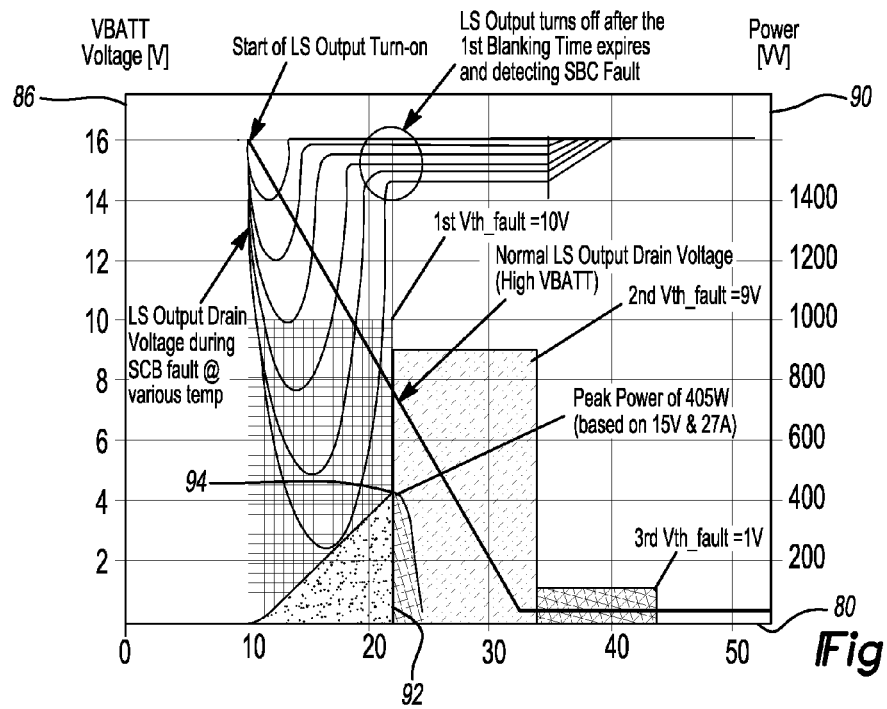
FIG. 3 is plot showing peak power during a short-circuit-to-battery fault as a function of time, in accordance with an embodiment of the present invention.

Referring now to FIGS. 2 and 3, charts demonstrating the operation of the low-side (LS) output pre-driver 10 and switch 12 are illustrated and will now be described. FIG. 2 shows the operation of the LS pre-driver 10 using drain voltage (V) vs. Time (μsec) at various levels of battery voltage VBATT during normal operation, i.e. in the absence of a short-circuit-to-battery (SCB) condition. VBATT may range from Low VBATT (about 9V) to High VBATT (about 16V) with Nominal VBATT at about 12V. One of the benefits of the present invention is having the flexibility of pegging the reference voltage as a percentage of VBATT instead of a predetermined reference voltage. Thus the reference voltage selector 22 automatically adjusts each of the first, second, and third reference voltages when VBATT is less than 12V. If VBATT is above 12V, the reference voltages remain at the same voltages as if VBATT was 12V.

The multi-phase blank/filter 18 and reference voltage selector 22 also enable the low-side (LS) output pre-driver 10 and switch 12 to use a slow slew-rate setting across the entire battery voltage VBATT 86 range without triggering a false SCB fault thus improving the reliability and accuracy of the fault detection scheme. In FIG. 2, the low-side pre-driver 10 turns on the switch 12 at the time indicated as 10 μsec on the x-axis 80. In order to improve electromagnetic compatibility (EMC) performance of the circuit, the slew rate 82 of the drain voltage during the turn-on transient is limited to not exceed approximately 0.7 V/μsec. Because the slew rate 82 of the drain voltage is limited, checking for a SCB condition must be delayed to avoid triggering a false positive fault condition during the turn-on transient. As shown in FIG. 2, under normal operation the drain voltage 84 takes in excess of 20 μsec after the turn-on time to get below 1 volt. If 1 volt was used as a threshold voltage to recognize a SCB condition and if the blanking time was accordingly set to exceed 20 μsec, in the presence of a SCB condition the switch 12 would have to conduct the high short-circuit current until the blanking interval expired and the pre-driver 10 called for the switch to turn off. During this blanking interval high power dissipation in the switch would occur, and the MOSFET would have to be sized to dissipate this power without damage.

As shown in FIG. 3, Power (W) 90 dissipated in the MOSFET 50 is shown in the presence of a SCB fault. With the fault detection circuit of the present invention, the MOSFET 50 can be turned off at the moment SCB fault is detected after the first blank time 92. In the present example, peak power 94 reached at the time of SCB fault detection is 405 W based on 15V and 27A. In contrast, with a single phase, predetermined reference voltage default detection scheme with a fault threshold of 1 volt and a blank time of 25 μsec, peak power can approach 825 W (based on 15V and 55A) before the single phase blank timer expires. Since the peak power possible on the present example is less than half the previous scheme, the MOSFET 50 can be resized to a smaller MOSFET 50.

The description of the invention is merely exemplary in nature and variations that do not depart from the gist of the invention are intended to be within the scope of the invention. Such variations are not to be regarded as a departure from the spirit and scope of the invention.

What is claimed is:

1. A low-side (LS) output pre-driver having a short-circuit-to-battery fault detection scheme for a MOSFET switch having a drain connection to a load connected to a battery voltage and a source connection tied to ground, the LS output pre-driver including:
   a comparator having a first input, a second input, and an output, wherein the first input of the comparator is configured to receive a voltage indicative of the voltage at the drain connection;
   a reference voltage selector configured to output one of a plurality of reference voltage signals to the second input of the comparator;
   a multi-phase blank/filter having an input connection and an output connection, and wherein the multi-phase blank/filter is configured to blank an incoming signal received from the comparator output during a plurality of time intervals, and
   a multi-phase control timer having a first timer output connection and a second timer output connection, and wherein the first timer output connection is configured to send a first signal to the reference voltage selector and the second timer output connection is configured to send a second signal to the multi-phase blank/filter; and
   wherein the first signal of the multi-phase control timer instructs the reference voltage selector to select which of the plurality of reference voltage signals is provided to the second input of the comparator, and the second signal of the multi-phase control timer instructs the multi-phase blank/filter to change from one of the plurality of time intervals to another of the plurality of time intervals.

2. The low-side (LS) output pre-driver of claim 1 wherein each of the plurality of reference voltage signals is a percentage of the maximum of the battery voltage and a predetermined limit voltage.

3. The low-side (LS) output pre-driver of claim 2 wherein the predetermined limit voltage is 12 volts.

4. The low-side (LS) output pre-driver of claim 1 wherein the plurality of reference voltage signals includes a first, a second, and a third reference voltage signal.

5. The low-side (LS) output pre-driver of claim 4 wherein the reference voltage selector further includes seven resistors, a Zener diode, and a selector, and wherein the first reference voltage signal is approximately 7% of the battery voltage, the second voltage signal is approximately 50% of the battery voltage, and the third reference voltage is approximately 92% of the battery voltage.

6. The low-side (LS) output pre-driver of claim 1 wherein the plurality of reference voltage signals are obtained by a plurality of voltage divider circuits fed from a common voltage source.

7. The low-side (LS) output pre-driver of claim 1 wherein the plurality of time intervals includes a first time interval, a second time interval, and a third time interval.

8. The low-side (LS) output pre-driver of claim 7 wherein the first time interval is about 12 μsec, the second time interval is about 12 μsec, and the third time interval is about 10 μsec.

9. A low-side (LS) output pre-driver having a short-circuit-to-battery fault detection scheme for a MOSFET switch having a drain connection to a load connected to a battery voltage and a source connection tied to ground, the LS output pre-driver including:
   a comparator having a first input, a second input, and an output, wherein the first input of the comparator is configured to receive a voltage indicative of the voltage at the drain connection;
   a reference voltage selector configured to output one of a first reference voltage signal, a second reference voltage signal, and a third reference voltage signal, to the second input of the comparator;
   a multi-phase blank/filter having an input connection and an output connection, and wherein the multi-phase blank/filter is configured to blank an incoming signal received from the comparator output during a plurality of time intervals; and
   a multi-phase control timer having a first timer output connection and a second timer output connection, and wherein the first timer output connection is configured to send a first signal to the reference voltage selector and the second timer output connection is configured to send a second signal to the multi-phase blank/filter; and
   wherein the first signal of the multi-phase control timer instructs the reference voltage selector to select which of the first reference voltage signal, the second reference voltage signal, and the third reference voltage signal is provided to the second input of the comparator, and the second signal of the multi-phase control timer instructs the multi-phase blank/filter to change from one of the plurality of time intervals to another of the plurality of time intervals.

10. The low-side (LS) output pre-driver of claim 9 wherein each of the reference voltage signals is a percentage of the maximum of the battery voltage and a predetermined limit voltage.

11. The low-side (LS) output pre-driver of claim 10 wherein the predetermined limit voltage is 12 volts.

12. The low-side (LS) output pre-driver of claim 9 wherein the plurality of time intervals includes a first interval, a second interval, and a third time interval.

13. The low-side (LS) output pre-driver of claim 12 wherein the first time interval is about 12 μsec, the second time interval is about 12 μsec, and the third time interval is about 10 μsec.

14. The low-side (LS) output pre-driver of claim 9 wherein the reference voltage selector further includes seven resistors, a Zener diode, and a selector, and wherein the first reference voltage signal is approximately 7% of the battery voltage, the second voltage signal is approximately 50% of the battery voltage, and the third reference voltage is approximately 92% of the battery voltage.

15. A low-side (LS) output pre-driver having a short-circuit-to-battery fault detection scheme for a MOSFET switch having a drain connection to a load connected to a battery voltage and a source connection tied to ground, the LS output pre-driver including:
   a comparator having a first input, a second input, and an output, and wherein the first input of the comparator is configured to receive a voltage indicative of the voltage at the drain connection;
   a reference voltage selector configured to output one of a first, a second, and a third reference voltage signal to the second input of the comparator;
   a multi-phase blank/filter having an input and an output, and wherein the multi-phase blank/filter is configured to blank an incoming signal during a first interval, a second interval, and a third time interval, and a multi-phase control timer having a first output and a second output, and wherein the first output is configured to send a first signal to the reference voltage selector and the second output is configured to send a second signal to the multi-phase blank/filter; and wherein the first signal of the multi-phase control timer instructs the reference voltage selector to change the from one of the plurality of reference voltage signals to another of the plurality of reference voltage signals, and the second signal of the multi-phase control timer instructs the multi-phase blank/filter to change from one of a plurality of time intervals to another of the plurality of time intervals.

16. The low-side (LS) output pre-driver of claim 15 wherein each of the plurality of reference voltage signals are a percentage of the maximum of the battery voltage and a predetermined limit voltage.

17. The low-side (LS) output pre-driver of claim 16 wherein the predetermined limit voltage is 12 volts.

18. The low-side (LS) output pre-driver of claim 15 wherein the plurality of time intervals includes a first interval, a second interval, and a third time interval.

19. The low-side (LS) output pre-driver of claim 18 wherein the first time interval is about 12 μsec, the second time interval is about 12 μsec, and the third time interval is about 10 μsec.

20. The low-side (LS) output pre-driver of claim 15 wherein the reference voltage selector further includes seven resistors, a Zener diode, and a selector, and wherein the first reference voltage signal is approximately 7% of the battery voltage, the second voltage signal is approximately 50% of the battery voltage, and the third reference voltage is approximately 92% of the battery voltage.

* * * * *